United States Patent
Kawakita

(10) Patent No.: US 7,825,705 B2
(45) Date of Patent: Nov. 2, 2010

(54) RESET SIGNAL GENERATING CIRCUIT

(75) Inventor: Kenichi Kawakita, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/458,331

(22) Filed: Jul. 8, 2009

(65) Prior Publication Data

US 2010/0013529 A1 Jan. 21, 2010

(30) Foreign Application Priority Data

Jul. 18, 2008 (JP) .............................. 2008-187082

(51) Int. Cl.
*H03L 7/00* (2006.01)
(52) U.S. Cl. .............................. 327/143; 327/77; 327/81
(58) Field of Classification Search .................. 327/143, 327/198, 77, 78, 80, 81
See application file for complete search history.

(56) References Cited

U.S. PATENT DOCUMENTS 6,972,602 B2 * 12/2005 Akamatsu et al. ........... 327/143
7,696,795 B2 * 4/2010 Choi ........................... 327/143
2003/0201807 A1 * 10/2003 Ohbayashi et al. .......... 327/143

FOREIGN PATENT DOCUMENTS

JP 2001-285046 10/2001

* cited by examiner

*Primary Examiner*—Long Nguyen
(74) *Attorney, Agent, or Firm*—McGinn IP Law Group, PLLC

(57) ABSTRACT

A reset signal generating circuit outputs a reset signal having a sufficient pulse width even when the power supply voltage is fluctuated. A node B reaches a high level during a power-on reset and is at a low level during operation. When a power supply (Vcc) fluctuates during operation and as soon as a node C reaches a high level, a switch element MN50 turns on, the node B is decreased to a low level, and a stable low-level reset signal RST1 is outputted. When the node B reaches a low level, a switch element MN51 turns off with a delay and capacitors 104 and 105 are gradually charged by a charging circuit 112. When the potential at the node B exceeds a threshold level of an inverter circuit 106, the reset signal RST1 is brought back to a high level, the reset is cancelled, the switch element MN50 is turned off, and the switch element MN51 is brought to be in an on-state again (FIG. 1).

10 Claims, 3 Drawing Sheets

RESET SIGNAL GENERATING CIRCUIT

REFERENCE TO RELATED APPLICATION

This application is based upon and claims the benefit of the priority of Japanese patent application No. 2008-187082, filed on Jul. 18, 2008, the disclosure of which is incorporated herein in its entirety by reference thereto.

TECHNICAL FIELD

The present invention relates to a reset signal generating circuit, and in particular, to a reset signal generating circuit that detects a change in the power supply voltage and automatically outputs a reset pulse.

BACKGROUND

In recent years, as mobile devices become widely used, battery-powered power supplies are increasingly used as a power supply for semiconductor integrated circuits such as microcomputers. When such mobile device is driven by a battery, charges of the battery are consumed with lapse of the operating time of the mobile device, and the power supply voltage of a semiconductor integrated device used decreases over a sufficiently long period of time. It is required that microcomputers do not run out of control even when the power supply voltage decreases. Based on this standpoint, reset signal generating circuits that detect a decrease in the power supply voltage and then output a reset signal are increasingly used in semiconductor integrated circuits such as microcomputers.

FIG. 3 shows a block diagram of a conventional reset signal generating circuit disclosed in Patent Document 1. In this conventional reset signal generating circuit, a comparator 12 compares a voltage Vin1, which is obtained by dividing a power supply voltage Vcc with resistors R1 and R2, and a reference voltage Vref, which is obtained from a reference voltage generating circuit 15. As soon as the power supply voltage Vcc decreases for some reason and the voltage Vin1 falls below the reference voltage, the comparator 12 turns on a switch SW0 composed of an N-channel MOS transistor to discharge charges accumulated in a capacitor C0, and a Schmitt circuit 14 outputs a low-level reset signal RES. Even after the power supply voltage Vcc is recovered, the capacitor C0 is gradually charged by a constant current circuit IO, and the period during which the reset signal RES is at a low level continues until a logic threshold voltage of the Schmitt circuit 14 is exceeded. Patent Document 1 discloses that, even when the power supply voltage decreases instantaneously, system malfunctions can be avoided by generating a reset signal having a certain length.

[Patent Document 1]
  Japanese Patent Kokai Publication No. JP-P2001-285046A

SUMMARY

The entire disclosure of Patent Document 1 is incorporated herein by reference thereto. The following analyses are given by the present invention.

According to studies made by the inventor of the present invention, it was found that this conventional reset signal generating circuit may still output a short reset pulse when the power supply voltage is fluctuated by noise. In a reset signal generating circuit 1 shown in FIG. 3, the switch SW0 does not turn on unless the power supply voltage Vcc falls below a certain voltage level. However, while the LSI is running, if the power supply voltage Vcc increases instantaneously by noise caused for some reason, the logic threshold voltage of the Schmitt circuit 14 driven by the power supply voltage Vcc is also instantaneously increased. However, since an input voltage Vin2 of the Schmitt circuit 14 is connected to ground via the capacitor C0, even when the power supply voltage Vcc is instantaneously increased, the voltage Vin2 holds its original voltage level. Thus, when the power supply voltage Vcc is instantaneously increased and the logic threshold voltage of the Schmitt circuit 14 is accordingly increased instantaneously, there is a possibility that the input voltage Vin2 may fall below the logic threshold voltage of the Schmitt circuit 14.

Particularly, when the power supply voltage Vcc is decreased to a level immediately above the voltage level at which the comparator 12 inverts, an output voltage of the comparator 12 is brought to a midpoint potential, and the switch SW0 composed of an N-channel MOS transistor is brought to be in a half-on state. Namely, there are cases where the input voltage Vin2 is slightly higher than the logic threshold voltage of the Schmitt circuit 14. In this case, the Schmitt circuit 14 is easily inverted by minimal noise.

In this case, while the reset signal RES is brought to be at a low level and is then outputted, the switch SW0 is not completely turned on and the voltage Vin2 holds its original voltage level. Thus, when the power supply voltage Vcc is recovered, the logic threshold voltage of the Schmitt circuit 14 returns to its original level, and the reset signal RES is also brought to be at its original high level, again. In this case, since a time constant circuit composed of the constant current circuit IO and the capacitor C0 does not function, the reset signal RES results in a short pulse. With such reset signal having a short pulse, a reset pulse width necessary to reset all the circuits in a semiconductor integrated circuit cannot be obtained, resulting in an insufficient reset state. Consequently, the semiconductor integrated circuit may malfunction and run out of control. Thus there is much desired in the art.

According to one aspect of the present invention, there is provided a reset signal generating circuit. The reset signal generating circuit includes a power supply voltage detecting circuit, a first capacitor, a charging circuit, a first switch element, and a waveform generating circuit. The power supply voltage detecting circuit detects a voltage of a power supply. The first capacitor is connected between a first node and a reference potential. The charging circuit is connected to the first node for charging the first capacitor with a constant current. The first switch element is connected to the first node for discharging charges in the first capacitor when the power supply voltage detecting circuit detects a decrease in the voltage of the power supply. The waveform generating circuit determines a voltage level at the first node and outputs a reset signal when the voltage level at the first node is determined to be low. The waveform generating circuit includes a second switch element, a second capacitor, and a third switch element. The second switch element includes one end thereof connected to the first node and turns on when the voltage level at the first node is determined to be low. The second capacitor is connected in parallel to the first capacitor via the second switch element. The third switch element discharges the second capacitor when the reset signal is not outputted.

The meritorious effects of the present invention are summarized as follows.

According to the present invention, even when the power supply voltage is fluctuated by noise or the like, it is possible to prevent a reset signal having an improper short pulse width from being outputted.

PREFERRED MODES

An outline of an exemplary embodiment of the present invention will be described with reference to the drawings as needed.

Figure 1:
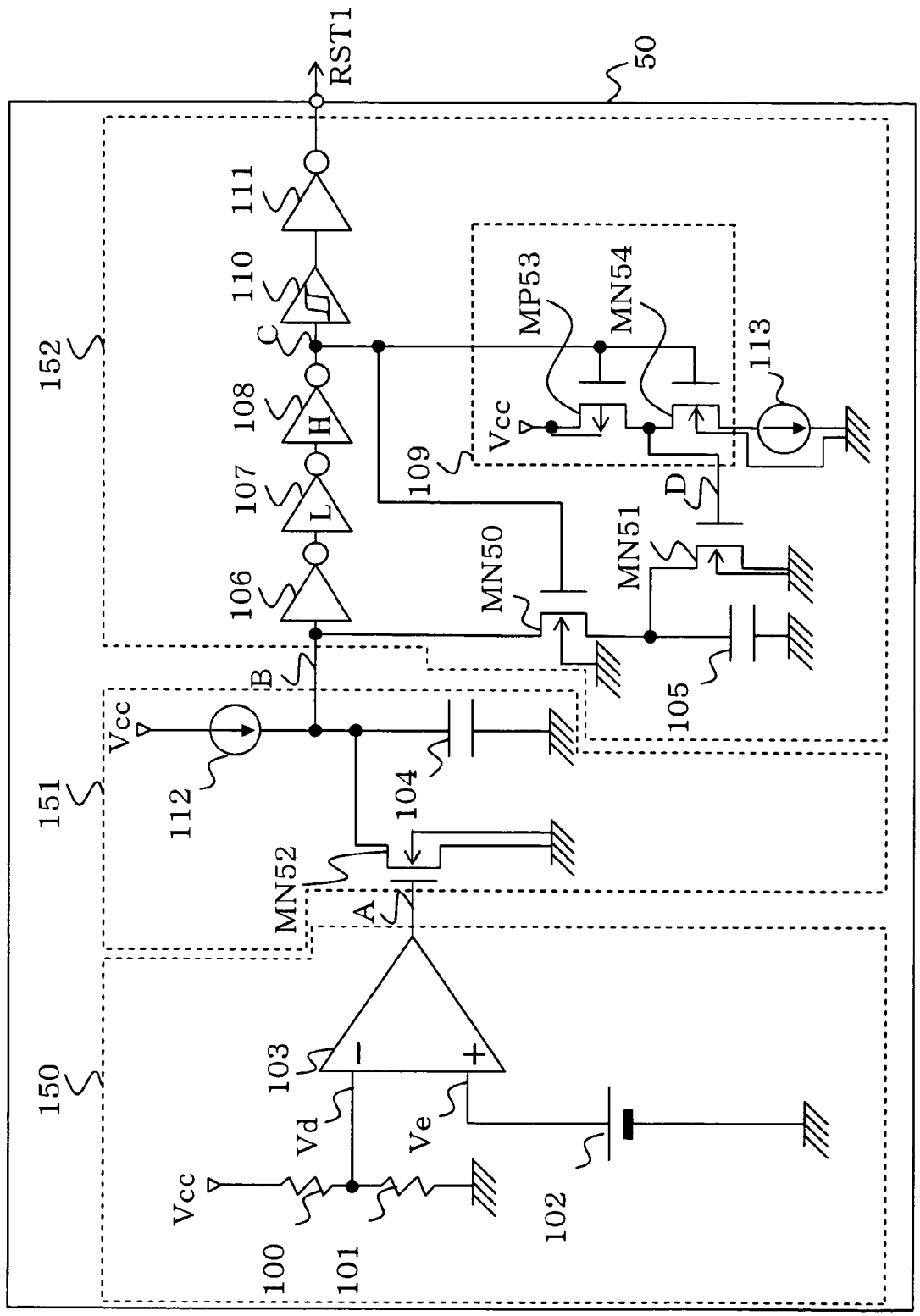
FIG. 1 shows a block diagram of a reset signal generating circuit according to one exemplary embodiment of the present invention.

A reset signal generating circuit shown in FIG. 1 according to one exemplary embodiment of the present invention includes: a power supply voltage detecting circuit 150 for detecting a power supply voltage Vcc; a first capacitor 104 connected between a first node B and a reference potential (ground); a charging circuit 112 connected to the first node B for charging the first capacitor 104 with a constant current; a first switch element MN52 connected to the first node B for discharging charges in the first capacitor 104 when the power supply voltage detecting circuit 150 detects a decrease in the power supply voltage; and a waveform generating circuit 152 for determining a voltage level at the first node B and outputting a reset signal RST1 when the voltage level at the first node B is determined to be low. The waveform generating circuit 152 includes: a second switch element MN50 having one end thereof connected to the first node B and turning on when the voltage level at the first node B is determined to be low; a second capacitor 105 connected in parallel to the first capacitor 104 via the second switch element MN50; and a third switch element MN51 for discharging the second capacitor 105 when the reset signal RST1 is not outputted.

According to the above structure, when the waveform generating circuit 152 determines that the potential at the node B is low and outputs a reset signal, the second switch element MN50 is turned on and charges charged by the charging circuit 112 are moved from the node B to the capacitor 105 and are then discharged via the third switch element MN51. Thus, since the potential at the node B is decreased when a reset signal is outputted, a reset signal having a stable pulse can be outputted.

When the power supply voltage is greatly fluctuated by noise or the like, it is highly possible that system malfunctions could be caused. However, in accordance with the above structure, since the system can be reset without fail for failsafe purposes even in such case, crucial malfunctions can be prevented.

Also, in the reset signal generating circuit of one exemplary embodiment shown in FIG. 1, the waveform generating circuit 152 may include an inverter circuit 106 having an input terminal thereof connected to the first node B, and based on an output signal from the inverter circuit 106, output the reset signal RST1 and control turning on/off of the second and third switch elements (MN50 and MN51).

By allowing the reset signal to be outputted and controlling turning on/off of the switch elements MN50 and MN51 for decreasing the potential at the first node B based on an output signal from the inverter circuit 106, when the reset signal is outputted, a reset pulse having a certain width can be obtained without fail.

The reset signal generating circuit of one exemplary embodiment shown in FIG. 1 may include a switch driving circuit (109 and 113) for turning on the third switch element MN51 when an output signal from the inverter circuit 106 reaches a low level and for turning off the third switch element MN51 with a delay when an output signal from the inverter circuit 106 reaches a high level.

Since the above switch driving circuit (109 and 113) is provided, when the output signal from the inverter circuit 106 reaches a high level, the third witch element MN51 turns on. Consequently, the potential at the first node B can be decreased to the reference potential (ground) without fail via the second switch element MN50 and the third switch element MN51, and a stable reset signal can be outputted. Also, when the output signal from the inverter circuit 106 reaches a high level, the third switch element MN51 turns off with a delay, and in this way, the node B does not remain connected to the reference potential (ground) at the time of a reset. Thus, once the capacitors 104 and 105 are charged by the charging circuit 112, the reset state is cancelled.

Also, in the reset signal generating circuit of one exemplary embodiment shown in FIG. 1, the switch driving circuit (109 and 113) may include: a constant current circuit 113 connected to the reference potential (ground); and a constant-current-driven inverter circuit 109 connected to the power supply Vcc and the constant current circuit 113 for driving the third switch element MN51.

Also, in the reset signal generating circuit of one exemplary embodiment shown in FIG. 1, the first to third switch elements (MN52, MN50, and MN51) are composed of N-channel MOS transistors, the inverter circuit 106 and the constant-current-driven inverter circuit 109 are composed of CMOS inverters, and the second switch element MN50 and the constant-current-driven inverter circuit 109 are driven by a signal 108 in phase with an output signal from the inverter circuit 106.

Also, the reset signal generating circuit of one exemplary embodiment shown in FIG. 1 may include: a second and a third inverter circuits (107 and 108), assuming that the inverter circuit 106 is the first inverter circuit, connected in series in the subsequent stages of the first inverter circuit 106; and a Schmitt circuit 110 connected to the output signal from the third inverter circuit 108. The reset signal RST1 may be generated based on the output signal from the Schmitt circuit 110, and the output signal from the third inverter circuit 108 may be connected to a gate of the second switch element MN50 and a gate of the constant-current-driven inverter circuit 109.

Also, in the reset signal generating circuit of one exemplary embodiment shown in FIG. 1, the charging circuit 112 and the first capacitor 104 may be connected in series between the power supply Vcc and the reference potential (ground).

Also, in the reset signal generating circuit of one exemplary embodiment shown in FIG. 1, the first switch element MN52 may be connected in parallel to the first capacitor 104 and turned on/off by the output signal from the power supply voltage detecting circuit 150.

Also, in the reset signal generating circuit of one exemplary embodiment shown in FIG. 1, the second capacitor 105 may be connected between the other end of the second switch element MN50 and the reference potential.

Also, in the reset signal generating circuit of one exemplary embodiment shown in FIG. 1, the third switch element MN51 may be connected in parallel to the second capacitor 105.

The present invention will be hereinafter described in detail based on an exemplary embodiment with reference to the drawings.

Exemplary Embodiment 1

FIG. 1 shows a block diagram of a reset signal generating circuit of an exemplary embodiment 1 of the present invention. The structure of the reset signal generating circuit in FIG. 1 will be hereinafter described. A reset signal generating circuit 50 of the exemplary embodiment 1 includes: a power supply voltage detecting circuit 150 for detecting whether or not a power supply voltage is lower than a predetermined voltage; a time constant circuit 151 for decreasing a potential at a first node B to a low level for a certain period of time when the power supply voltage detecting circuit 150 detects a decrease in the power supply voltage; and a waveform generating circuit 152 for outputting a reset signal having a certain pulse width.

The power supply voltage detecting circuit 150 includes: resistors 100 and 101 for dividing a power supply voltage Vcc; a reference power supply 102; and a comparator 103 having a negative input connected to a divided voltage Vd and a positive input connected to a voltage Ve outputted from the reference power supply 102 and comparing the voltages Vd and Ve. When the voltage Ve is lower than the voltage Vd, the comparator 103 outputs a low-level output voltage to a node A, and when the voltage Ve is higher than the voltage Vd, the comparator outputs a high-level output voltage to the node A.

Also, the time constant circuit 151 includes: a first switch element MN52 that turns on when the comparator 103 outputs a high-level output voltage; a charging circuit 112 for charging a first node B with a constant current; and a first capacitor 104 connected between the first node B and a reference potential (ground potential). The first switch element MN52 is composed of an N-channel MOS transistor, and a gate thereof is connected to the output of the comparator 103, either of the drain or the source thereof is connected to the first node B, and the other end to the reference potential. While the reference potential is connected to ground in FIG. 1, the reference potential can be arbitrary as long as it is used as a reference.

The waveform generating circuit 152 includes: inverters 106 to 108 cascaded between the first node B and a node C; a Schmitt circuit 110 having the node C as an input thereof; and an inverter 111 that inverts an output from the Schmitt circuit 110 and outputs a reset signal RST1. The reset signal RST is brought to be at a low level at the time of a reset and is at a high level at any time other than at the time of a reset.

Further, the waveform generating circuit 152 includes: a second switch element MN50; a second capacitor 105 having one end thereof connected to the first node B via the second switch element MN50 and the other end thereof connected to a reference potential (ground); a third switch MN51 connected in parallel to the second capacitor 105; and a switch driving circuit (109 and 113) for driving the third switch element MN51. The second and third switch element MN50 and MN51 are both composed of N-channel MOS transistors, and a gate of the second switch element MN50 is connected to the output of the inverter 108. The switch driving circuit (109 and 113) includes: a constant current circuit 113 supplying a constant current to a reference potential (ground); and a constant-current-driven inverter circuit 109 connected to the power supply Vcc and the constant current circuit 113. A gate of the constant-current-driven inverter circuit 109 is connected to the inverter 108. The inverters 106, 107, 108, and 111 and the constant-current-driven inverter circuit 109 are composed of CMOS inverters.

Since three inverters are cascaded between the first node B and the node C, as soon as a voltage at the node B exceeds a logic threshold of the first inverter circuit 106 having the input terminal thereof connected to the first node B, a voltage at the node C outputted from the third inverter circuit 108, which is the inverter in the third stage among the cascaded inverters, reaches the Vcc level or the ground level without fail. Additionally, a logic threshold voltage of the second inverter circuit 107 is set to be lower than that of the first inverter circuit 106 and a logic threshold voltage of the third inverter circuit 108 is set to be higher than that of the second inverter circuit 107. Thus, once the voltage at the first node B falls below the logic threshold of the first inverter circuit 106, the voltage at the node C is immediately increased to Vcc.

Figure 2:
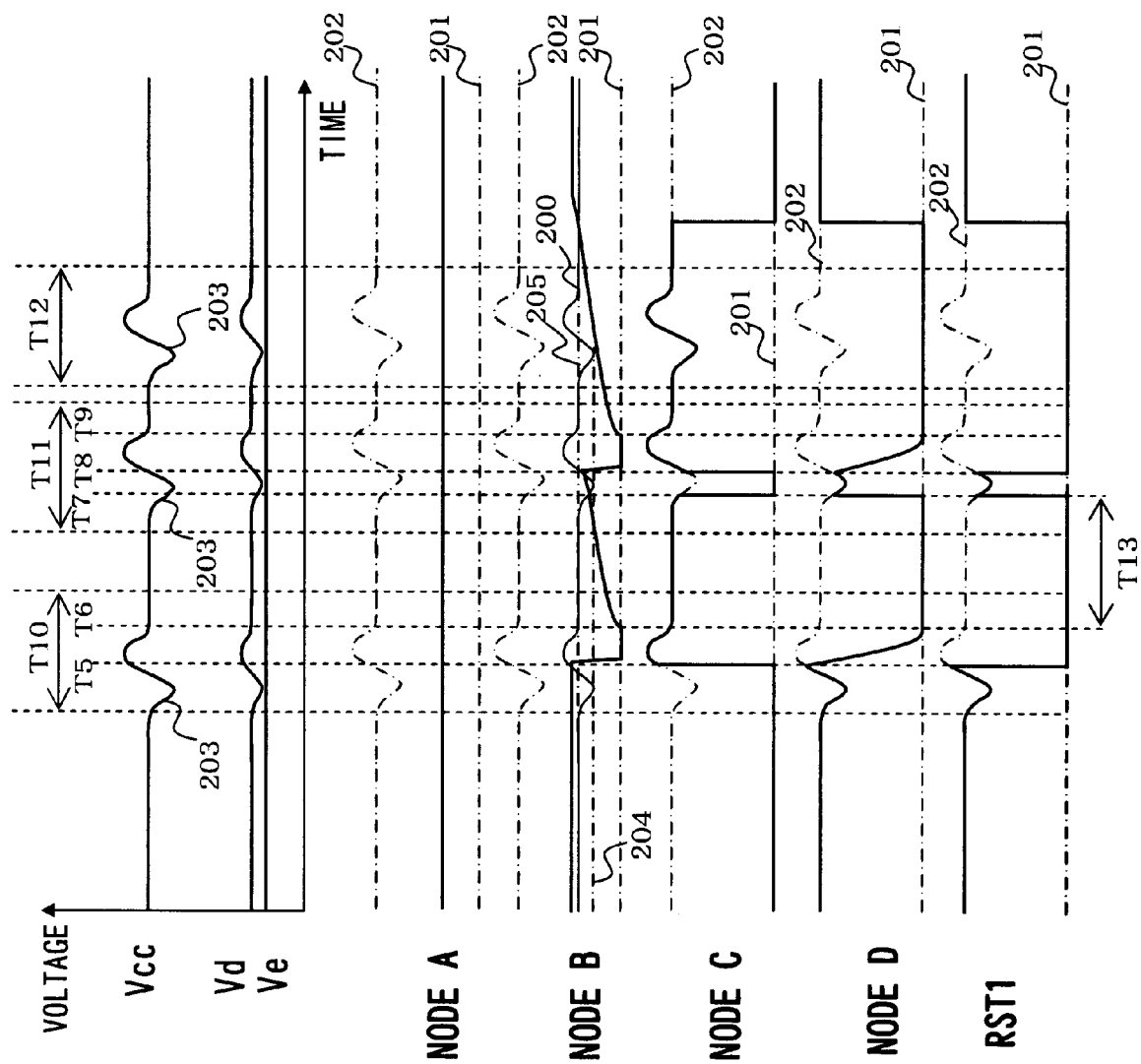
FIG. 2 shows an operation waveform diagram of the reset signal generating circuit according to one exemplary embodiment of the present invention.

Next, the operation of the reset signal generating circuit will be described with reference to the operation waveform diagram in FIG. 2.

In an initial state, the power supply voltage Vcc is slightly higher than a voltage level that the power supply voltage detecting circuit determines to be low. Namely, the voltage Vd obtained by dividing the power supply voltage Vcc with the resistors 100 and 101 is slightly higher than the reference voltage Ve outputted from the reference power supply 102. Since the comparator 103 outputs a midpoint potential, which is closer to a ground level 201 than to the Vcc level 202, the node A is at a midpoint potential closer to a low level. Thus, the first switch element MN52 composed of an N-channel MOS transistor is in a half-on state. While a constant current used for charging outputted from the charging circuit 112 flows to the reference potential (ground) via the first switch element MN52 in a half-on state, since the on-resistance of the first switch element MN52 is sufficiently large, the voltage at the first node B is slightly higher than a logic threshold 200 of the first inverter circuit 106, which is a midpoint potential between the power supply voltage Vcc 202 and the ground potential 201. Thus, the voltage at the node C buffered by the first to third inverter circuits 106 to 108 is at the ground level. In this state, the potential at the node D is at the Vcc level, and the reset signal RST1 at the Vcc level (in a non-reset state) is outputted. Also, since the second switch element MN50 is turned off and the third switch element MN51 is turned on, all the charges in the capacitor 105 are discharged to the ground, and the first capacitor 104 is separated from the second capacitor 105.

During a timing T10, the power supply voltage Vcc experiences a voltage fluctuation 203 by noise for the first time. As shown in the operation waveform diagram of FIG. 2, since the voltage Vd is still slightly higher than the voltage Ve even when the power supply voltage Vcc has been fluctuated by noise, the voltage at the node A remains at a midpoint potential close to a low level, and the first switch element MN52 remains in a half-on state. During the timing T10, the logic threshold 200 of the first inverter circuit 106 suffers variation depending on the variation of the power supply voltage Vcc 203 caused by the noise and once assumes a lowest level 204 followed by an increase, thereafter returning to a flat level 205 at the time of no noise.

When the power supply voltage Vcc rapidly increases at a timing T5, the logic threshold of the first inverter circuit 106 to which power is supplied from the power supply voltage Vcc also increases with the increase of the power supply voltage Vcc. In contrast, since the first capacitor 104 is disposed between the node B and the reference potential (ground), the potential at the node B does not change rapidly. Since the potential at the node B has been slightly higher than the logic threshold of the first inverter circuit 106, this fluctuation in the power supply easily causes the potential at the node B to fall below the logic threshold of the first inverter circuit 106. As described above, since the logic threshold of the second inverter circuit 107 is set to be lower than that of the first inverter circuit 106 and the logic threshold of the third inverter circuit 108 is set to be higher than that of the second inverter circuit 107, as soon as the potential at the node B falls below the logic threshold of the first inverter circuit 106, the potential at the node C is immediately increased to the Vcc level. As a result, first, the second switch element MN50 composed of an N-channel MOS transistor turns on. Since the third switch element MN51 is in an on-state and the second capacitor 105 is in a discharge state, the potential at the first node B is decreased to the ground voltage. Thus, the potential at the node C reaches a stable Vcc level. When the potential at the node C reaches Vcc, a reset signal RST1 is brought to a low level and is then outputted via the Schmitt circuit 110 and the inverter 111. Also, when the potential at the node C reaches Vcc, while the N-channel MOS transistor MN54 of the constant-current-driven inverter circuit 109 starts to conduct electricity, since the constant current circuit 113 provides the N-channel MOS transistor MN54 with power supply, the potential at the node D deceases only gradually. Thus, the third switch element MN51 remains in an on-state for a while.

Next, at a timing T6, the potential at the node D decreases to the ground level, and the third switch element MN51 turns off. Then, the first capacitor 104 and the second capacitor 105 start to be charged by the current supplied from the charging circuit 112, and the potential at the first node B starts to increase gradually.

Next, during a timing T11, the power supply voltage Vcc experiences the voltage fluctuation 203 by noise for the second time. In cases where the node B has been charged to a voltage level close to the logic threshold of the first inverter circuit 106 immediately before a timing T7, when the power supply voltage Vcc slightly decreases at the timing T7, the logic threshold of the first inverter circuit 106 decreases with the decrease of the power supply voltage Vcc. Then, the node B exceeds the logic threshold of the first inverter circuit 106, and the potential at the node C decreases to the ground level. Then, the second switch element MN50 turns off, the potential at the node D also increases to the Vcc level, the third switch element MN51 turns on, and the charges accumulated in the second capacitor 105 are discharged to the ground. However, the node B continues to be charged by the charging circuit 112. A high-level reset signal RST1 is outputted from the reset terminal.

Next, the power supply voltage Vcc increases (or recovers from the voltage drop at the timing T7) at a timing T8. Then, the logic threshold of the first inverter circuit 106 to which power is supplied from the power supply voltage Vcc also increases (recovers) with the increase (recovery) of the power supply voltage Vcc. In contrast, the potential at the node B does not change rapidly. While the potential at the node B has been slightly higher than the logic threshold of the first inverter circuit 106 since the timing T7, because of this fluctuation in the power supply (voltage recovery), the potential at the node B is brought to be lower than the logic threshold of the first inverter circuit 106. As soon as the logic threshold of the first inverter circuit 106 is exceeded, the potential at the node C immediately increases to the Vcc level. Then, the second switch element MN50 composed of an N-channel MOS transistor turns on. Since the third switch element MN51 is in an on-state and the second capacitor 105 is in a discharge state, the potential at the first node B is brought to the ground voltage. Thus, the potential at the node C reaches a stable Vcc level. When the potential at the node C reaches Vcc, the reset signal RST1 is brought to be at a low level via the Schmitt circuit 110 and the inverter 111, and it is outputted again. Further, when the potential at the node C reaches Vcc, the N-channel MOS transistor MN54 in the constant-current-driven inverter circuit 109 starts to conduct electricity. However, since the constant current circuit 113 provides the N-channel MOS transistor MN54 with power supply, the potential at the node D decreases only gradually. Thus, the third switch element MN51 remains in an on-state for a while.

Next, at a timing T9, the potential at the node D decreases to the ground level, and the third switch element MN51 turns off. Then, since the first capacitor 104 and the second capacitor 105 start to be charged by the current supplied from the charging circuit 112, the potential at the first node B starts to increase again.

Thereafter, the power supply voltage Vcc experiences the voltage fluctuation 203 by noise for the third time during a timing T12. However, since the potential at the node B is always lower than the logic threshold 200 of the first inverter circuit 106, the reset state is not cancelled. Finally, the potential at the node B exceeds the logic threshold 205 of the first inverter circuit 106 when there is no fluctuation in the power supply, and the reset state is then cancelled, returning to the initial state. According to the operation described above, even when there is a fluctuation in the power supply voltage, at least a reset pulse finally outputted when the power-supply fluctuation is settled can have a sufficient pulse width for initializing the entire semiconductor integrated circuit.

In the present invention, a reset signal having a sufficient pulse width can be obtained by designing a circuit based on the following formula:

A reset pulse width T13 is determined by the following formula (1), where C1 is the total capacitance value of the first capacitor 104 and the second capacitor 105, I1 is the value of the current for charging supplied from the charging circuit 112, I2 is the value of the current discharged from the N-channel MOS transistor MN52, and Vth1 is the lower-limit voltage of the inverter logical threshold when there is a fluctuation in the power supply.

$$T13=(C1 \times Vth1)/(I1-I2) \qquad \text{formula (1)}$$

Based on the above formula (1), a reset period necessary for semiconductor integrated devices can be obtained. For example, by setting C1=1 pF, Vth1=1V, and I1−I2=0.2 uA in the formula (1), that is, T13=(1 pF×1V)/0.2 uA=5 uS, a reset pulse width of 5 uS or more can be obtained.

Figure 3:
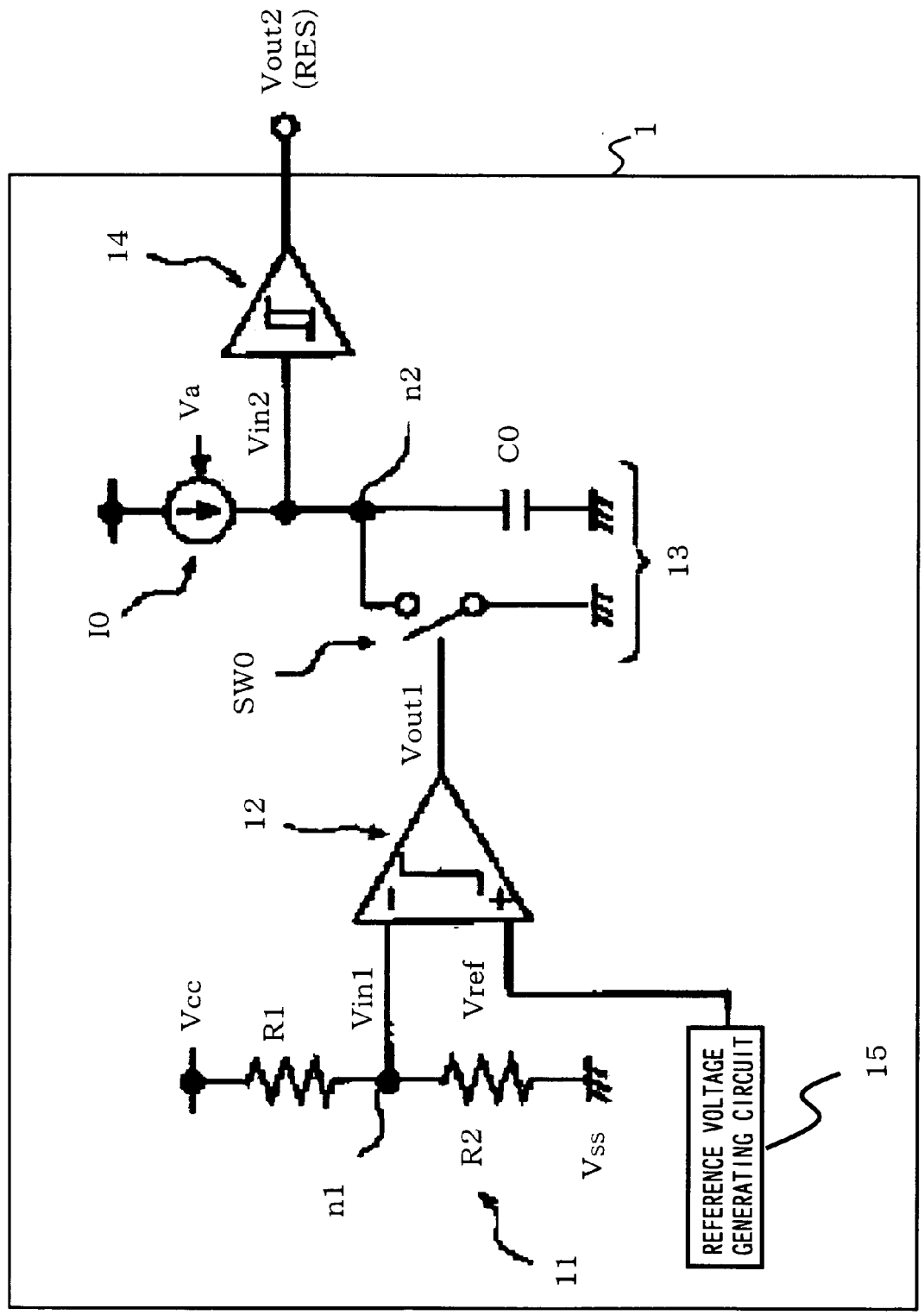
FIG. 3 shows a block diagram of a conventional reset signal generating circuit.

The above description regarding the operation was made based on cases where the power supply voltage Vcc is slightly higher than the reference voltage when not affected by noise. This is because a reset signal generating circuit is easily inverted by slight fluctuation in the power supply. However, effects of the present invention are not merely limited to such case. When the power supply voltage Vcc is at a normal potential, the comparator 103 outputs a clear low-level signal, and the potential at the first node B is almost at the Vcc level, if the power supply voltage Vcc is rapidly increased by large power-supply noise to a level twice (or more) as high as its original level, the reset signal generating circuit also inverts. Needless to say, a normal circuit operation cannot be expected when such large fluctuation in the power supply is caused. According to the present invention, since a reset signal having a reliable pulse width is outputted in such case for fail-safe purposes, malfunctions can be prevented. In contrast, according to a conventional reset signal generating circuit as shown in FIG. 3, in such case, even if the reset circuit functions, since only an improper reset signal is outputted, malfunctions cannot be recovered.

In the present invention, the following modes are possible.

(Mode 1): as mentioned as the one aspect.

(Mode 2): The waveform generating circuit may comprise an inverter circuit having an input terminal thereof connected to the first node, and based on an output signal from the inverter circuit, may output the reset signal and controls turning on/off of the second and third switch elements.

(Mode 3): The reset signal generating circuit may comprise a switch driving circuit that turns on the third switch element when an output signal from the inverter circuit reaches a low level and turns off the third switch element with a delay when an output signal from the inverter circuit reaches a high level.

(Mode 4): The switch driving circuit may comprise: a constant current circuit connected to the reference potential; and a constant-current-driven inverter circuit connected to the power supply and the constant current circuit for driving the third switch element.

(Mode 5): The first to third switch elements may comprise N-channel MOS transistors, the inverter circuit and the constant-current-driven inverter circuit comprise CMOS inverters, and the second switch element and the constant-current-driven inverter circuit may be driven by a signal in phase with an output signal from the inverter circuit.

(Mode 6): The reset signal generating circuit may farther comprise: second and third inverter circuits, assuming that the inverter circuit is a first inverter circuit, connected in series in the subsequent stages of the first inverter circuit; and a Schmitt circuit connected to an output signal from the third inverter circuit, wherein the reset signal is generated based on an output signal from the Schmitt circuit, and an output signal from the third inverter circuit is connected to a gate of the second switch element and a gate of the constant-current-driven inverter circuit.

(Mode 7): The charging circuit and the first capacitor may be connected in series between the power supply and the reference potential.

(Mode 8): The first switch element may be connected in parallel to the first capacitor and turned on/off by an output signal from the power supply voltage detecting circuit.

(Mode 9): The second capacitor may be connected between the other end of the second switch element and the reference potential.

(Mode 10): The third switch element may be connected in parallel to the second capacitor.

While the present invention has been described based on examples, the present invention is not merely limited to the above examples, and it is understand by those skilled in the art that various changes and modifications may be made in the present invention without departing from the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A reset signal generating circuit comprising:
   a power supply voltage detecting circuit for detecting a voltage of a power supply;
   a first capacitor connected between a first node and a reference potential;
   a charging circuit, connected to the first node, that charges the first capacitor with a constant current;
   a first switch element, connected to the first node, that discharges charges in the first capacitor when the power supply voltage detecting circuit detects a decrease in the voltage of the power supply; and
   a waveform generating circuit that determines a voltage level at the first node and outputting a reset signal when the voltage level at the first node is determined to be low,
   wherein the waveform generating circuit comprises:
   a second switch element having one end thereof connected to the first node and turning on when the voltage level at the first node is determined to be low;
   a second capacitor connected in parallel to the first capacitor via the second switch element; and
   a third switch element that discharges the second capacitor when the reset signal is not outputted.

2. The reset signal generating circuit according to claim 1, wherein the waveform generating circuit comprises an inverter circuit having an input terminal thereof connected to the first node, and based on an output signal from the inverter circuit, outputs the reset signal and controls turning on/off of the second and third switch elements.

3. The reset signal generating circuit according to claim 2, comprising a switch driving circuit that turns on the third switch element when an output signal from the inverter circuit reaches a low level and turns off the third switch element with a delay when an output signal from the inverter circuit reaches a high level.

4. The reset signal generating circuit according to claim 3, wherein the switch driving circuit comprises: a constant current circuit connected to the reference potential; and a constant-current-driven inverter circuit connected to the power supply and the constant current circuit for driving the third switch element.

5. The reset signal generating circuit according to claim 4, wherein the first to third switch elements comprise N-channel MOS transistors, the inverter circuit and the constant-current-driven inverter circuit comprise CMOS inverters, and the second switch element and the constant-current-driven inverter circuit are driven by a signal in phase with an output signal from the inverter circuit.

6. The reset signal generating circuit according to claim 5, comprising: second and third inverter circuits, assuming that said inverter circuit is a first inverter circuit, connected in series in the subsequent stages of the first inverter circuit; and a Schmitt circuit connected to an output signal from the third inverter circuit, wherein the reset signal is generated based on an output signal from the Schmitt circuit, and an output signal from the third inverter circuit is connected to a gate of the second switch element and a gate of said constant-current-driven inverter circuit.

7. The reset signal generating circuit according to claim 1, wherein the charging circuit and the first capacitor are connected in series between the power supply and the reference potential.

8. The reset signal generating circuit according to claim 1, wherein the first switch element is connected in parallel to the first capacitor and turned on/off by an output signal from the power supply voltage detecting circuit.

9. The reset signal generating circuit according to claim 1, wherein the second capacitor is connected between the other end of the second switch element and the reference potential.

10. The reset signal generating circuit according to claim 1, wherein the third switch element is connected in parallel to the second capacitor.

* * * * *